US010371749B1

(12) United States Patent
Douskey et al.

(10) Patent No.: US 10,371,749 B1
(45) Date of Patent: *Aug. 6, 2019

(54) REMOVAL OF OVER-MASKING IN AN ON PRODUCT MULTIPLE INPUT SIGNATURE REGISTER (OPMISR) TEST

(71) Applicant: International Business Machines Corporation, Armonk, NY (US)

(72) Inventors: Steven M. Douskey, Rochester, MN (US); Mary P. Kusko, Hopewell Junction, NY (US); Amanda R. Kaufer, Hopewell Junction, NY (US); Michael J. Hamilton, Rochester, MN (US); Matthew B. Schallhorn, Greensboro, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/119,458

(22) Filed: Aug. 31, 2018

(51) Int. Cl.
*G01R 31/3177* (2006.01)
*G01R 31/317* (2006.01)

(52) U.S. Cl.
CPC ..... *G01R 31/3177* (2013.01); *G01R 31/3172* (2013.01)

(58) Field of Classification Search
CPC ........ G01R 31/3177; G01R 31/318544; G01R 31/3172; G01R 31/318541; G01R 31/318552; G01R 31/31704; G06F 17/505
See application file for complete search history.

(56) References Cited

U.S. PATENT DOCUMENTS 6,715,105 B1 * 3/2004 Rearick .......... G01R 31/318547
714/30
6,807,645 B2 10/2004 Angelotti et al.
(Continued)

FOREIGN PATENT DOCUMENTS

EP 1722246 A2 11/2006

OTHER PUBLICATIONS

B. Keller, "Encounter test OPMISR/sup +/ on-chip compression," IEEE International Conference on Test, 2005., Austin, TX, 2005, pp. 2 pp. −1287.*

(Continued)

*Primary Examiner* — Cynthia Britt
(74) *Attorney, Agent, or Firm* — Joan Pennington

(57) ABSTRACT

A method and test circuit are provided for implementing enhanced scan data testing with removal of over masking in an on product multiple input signature register (OPMISR) test, and a design structure on which the subject circuit resides. Common Channel Mask Scan Registers (CMSR) data is used with a multiple input signature register (MISR) in each satellite. A test algorithm control is used for implementing enhanced scan data testing to allow sharing the CMSR data and common Channel Mask Enable (CME) pins with removal of over masking. Selectively pausing scan unload is provided for each respective satellite when wrong CME data for the respective satellite is at the CME pins. Each satellite includes a select signal which controls advancing the scan into the MISR. The select signal is used to selectively pause the scan unload for the respective satellite.

20 Claims, 12 Drawing Sheets

(56) References Cited

U.S. PATENT DOCUMENTS

| | | | |
|---|---|---|---|
| 7,032,148 B2* | 4/2006 | Wang | G01R 31/318536 714/726 |
| 7,461,309 B2 | 12/2008 | Kiryu | |
| 7,500,163 B2 | 3/2009 | Rajski et al. | |
| 7,509,551 B2* | 3/2009 | Koenemann | G01R 31/31703 714/732 |
| 7,523,370 B1* | 4/2009 | Keller | G01R 31/318547 714/726 |
| 7,823,034 B2* | 10/2010 | Wohl | G01R 31/318547 714/726 |
| 8,006,150 B2* | 8/2011 | Sinanoglu | G01R 31/318547 714/726 |
| 8,086,923 B2* | 12/2011 | Cheng | G01R 31/31813 714/726 |
| 8,103,926 B2* | 1/2012 | Gizdarski | G01R 31/318547 714/25 |
| 8,166,359 B2 | 4/2012 | Rajski et al. | |
| 8,438,437 B2* | 5/2013 | Jain | G01R 31/318547 714/726 |
| 8,898,529 B2 | 10/2014 | Goessel et al. | |
| 9,355,203 B2* | 5/2016 | Douskey | G06F 17/5072 |
| 9,378,318 B2 | 6/2016 | Douskey et al. | |
| 9,702,934 B1* | 7/2017 | Meehl | G01R 31/318335 |
| 2009/0300446 A1* | 12/2009 | Rajski | G01R 31/318547 714/726 |
| 2012/0278672 A1* | 11/2012 | Sinanoglu | G01R 31/318547 714/726 |
| 2016/0341795 A1* | 11/2016 | Chandra | G01R 31/318536 |

OTHER PUBLICATIONS

C. Barnhart, V. Brunkhorst, F. Distler, O. Farnsworth, B. Keller and B. Koenemann, "OPMISR: the foundation for compressed ATPG vectors," Proceedings International Test Conference 2001 (Cat. No. 01CH37260), Baltimore, MD, USA, 2001, pp. 748-757.*

S. Kim, J. Chung and J. Yang, "Mitigating Observability Loss of Toggle-BasedX-Masking via Scan Chain Partitioning," in IEEE Transactions on Computers, vol. 67, No. 8, pp. 1184-1192, Aug. 1, 2018.*

S. Ohtake and D. Shimazu, "An approach to LFSR-based X-masking for built-in self-test," 2017 18th IEEE Latin American Test Symposium (LATS), Bogota, 2017, pp. 1-4.*

O. Sinanoglu, "Toggle-Based Masking Scheme for Clustered Unknown Response Bits," 2011 Sixteenth IEEE European Test Symposium, Trondheim, 2011, pp. 105-110.*

J. Kang, N. A. Touba and J. Yang, "Reducing control bit overhead for X-masking/X-canceling hybrid architecture via pattern partitioning," 2016 53nd ACM/EDAC/IEEE Design Automation Conference (DAC), Austin, TX, 2016, pp. 1-6.*

Nur A. Touba, X-Canceling MISR—An X-Tolerant Methodology for Compacting Output Responses with Unknow Using a MISR, pp. 1-10, 2007 https://www.semanticscholar.org/paper/X-canceling-MISR-An-X-tolerant-methodology-for-com-Touba/ 549002bff2c83634b7f77a311d97cce875963a65.

Appendix P List of Patents and Patent Applications Treated as Related Feb. 6, 2019.

* cited by examiner

230

| B0 | B1 | FUNCTION |
|----|----|----------|
| 0 | 0 | NO MASKING (MISR ENABLED) |
| 0 | 1 | MASK USING REGISTER0 (MISR ENABLED) |
| 1 | 0 | MASK USING REGISTER1 (MISR ENABLED) |
| 1 | 1 | GLOBAL MISR MASK ALL CHANNELS |

REMOVAL OF OVER-MASKING IN AN ON PRODUCT MULTIPLE INPUT SIGNATURE REGISTER (OPMISR) TEST

FIELD OF THE INVENTION

The present invention relates generally to the data processing field, and more particularly, relates to a method and circuit for implementing enhanced scan data testing with removal of over masking in an on product multiple input signature register (OPMISR) test due to channel mask scan register (CMSR) data sharing, and a design structure on which the subject circuit resides.

BACKGROUND

Circuits typically are prone to defects introduced during a manufacturing process. To test for defects, a scan input may be applied to scan channels, clocks triggered and the result of the scan outputs from the scan channels may be analyzed. The test may include large numbers and variations of scan inputs being applied to scan channels of the circuit. Typically the tests take a great amount of time, produce large amounts of data for analysis, and require large amounts of resources for that analysis.

As Application Specific Integrated Circuit (ASIC) and Processor chips continue to get larger, test data volume and test time naturally increase as well. It continually becomes even more important to increase test efficiency. One method to increase efficiency is to deliver scan data in parallel to many parts of the chip at once, usually through a fan-out network feeding to many channels, which in turn feed a section of logic on the chip, and have that accompanied with a Multiple Input Signature Register (MISR) for on-chip data compression. This technique is called On Product Multiple Input Signature Register (OPMISR). This also includes a method for masking specific data in the channels, which can be used to prevent possible corruption of the MISR. This method for masking specific data in the channels method including an OPMISR+ and OPMISR++ test versions were developed and are supported by Cadence Corporation.

Typically, OPMISR masking has two mask latches per MISR bit that are referred to as Channel Mask Scan Bits in Channel Mask Scan Registers (CMSRs) and two Channel Mask Enable (CME) signals. The CME signals decode to four states of: no masking, use mask bit 1, use mask bit 2, or mask all channels. The masking is applied as the data is unloaded from the channel into the MISR. When a bit position in a channel is going to shift into the MISR, the global CME signal is set to the desired mask state. For example, if channel 3 needs scan position 28 to be ignored, when bit 28 of the channel is about to be shifted into the MISR during the unload, the CME signals could be set to use mask register 1. The channel 3 mask scan bit in mask register 1 would have previously been set to mask. Other mask bits for other channels may or may not have been set to mask based on needs for the rest of the scan unload.

In large complex processors there can be more than one MISR. As used in the following description and claims, an OPMISR+ satellite includes one MISR and the channels above the MISR. With common Channel Mask Scan Registers (CMSRs) scanned into multiple OPMISR+ satellites and a global pair of Channel Mask Enable (CME) signals, typically there is over masking in OPMISR+ test patterns, which reduces the effectiveness of the patterns. It can be more practical to have several of these OPMISR+ satellites spread throughout the chip. For most efficient scanning and less scan data, the Channel Mask Scan Bits for register 0 and register 1 are scan initialized in parallel and shared across satellites. However, this means all satellites have the same mask bits. Additionally, typically all satellites get the same CME information during unload. For example, assume the first satellite needed bit 4 of the channel mask scan register set and used at the scan position 28 but the second satellite did not. With both satellites receiving the same data for the channel mask scan register the bit in the second satellite would unnecessarily be masked at the same time as the bit in the first mask register.

Thus, while it is efficient to share channel mask enable data, one is left with the problem of over masking. All the channels with their mask bit set are masked whenever the CME signals indicates to use that masking, even if that bit position was needed to be masked on just one channel in just one satellite.

SUMMARY OF THE INVENTION

Principal aspects of the present invention are to provide a method and test circuit for implementing enhanced scan data testing with removal of over masking in an on product multiple input signature register (OPMISR) test, and a design structure on which the subject circuit resides. Other important aspects of the present invention are to provide such method and circuit substantially without negative effects and that overcome many of the disadvantages of prior art arrangements.

In brief, a method and test circuit are provided for implementing enhanced scan data testing with removal of over masking in an on product multiple input signature register (OPMISR) test, and a design structure on which the subject circuit resides. Common Channel Mask Scan Registers (CMSR) data is used with a multiple input signature register (MISR) in each satellite. A test algorithm control is used for implementing enhanced scan data testing to allow sharing the CMSR data and common Channel Mask Enable (CME) pins with removal of over masking. Selectively pausing scan unload is provided for each respective satellite when wrong CME data for the respective satellite is at the CME pins. Each satellite includes a select signal which controls advancing the scan into the MISR. The select signal is used to selectively pause the scan unload for the respective satellite.

In accordance with features of the invention, enhanced scan data testing is effectively and efficiently implemented, enabling data volume reduction and minimizing over masking.

In accordance with features of the invention, CME values for each satellite for each scan unload bit position are identified for use to determine an order of satellite selection and CMEs.

In accordance with features of the invention, operations start with a first scan unload bit position across all satellites. For each satellite's data ready at unload, it is first determined if all CMEs match for all the satellites. When all CMEs match for all the satellites, all the satellites are unloaded for one scan cycle. When this is the last bit, operations are done.

In accordance with features of the invention, when all CMEs do not match for all the satellites, then it is determined if any CMEs matches for respective satellites. When there are no CMEs matches, then one satellite is unloaded and the process repeats when it is not the last bit.

In accordance with features of the invention, when some CMEs match then the matching CMEs of the respective satellites are selected for unload and other respective satellite or satellites are not selected to selectively pause the scan unload for the respective satellite or satellites for removal of over masking.

BRIEF DESCRIPTION OF THE DRAWINGS

The present invention together with the above and other objects and advantages may best be understood from the following detailed description of the preferred embodiments of the invention illustrated in the drawings, wherein:

FIGS. 2A and 2B respectively illustrate an example on product multiple input signature register (OPMISR) test circuit in accordance with preferred embodiments of the invention;

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit are provided for implementing enhanced scan data testing with removal of over masking in an on product multiple input signature register (OPMISR) test, and a design structure on which the subject circuit resides. A common Channel Mask Scan Registers (CMSR) data is used with a multiple input signature register (MISR). An algorithm is used for implementing enhanced scan data testing by selectively pausing of a scan unload of a selected respective OPMISR+ satellite. Each satellite includes a select signal which controls advancing the scan into the MISR. This select signal is used to selectively pause the scan unload for the respective satellite(s) when the wrong CME data for the respective satellite is at the pins.

Figure 1:
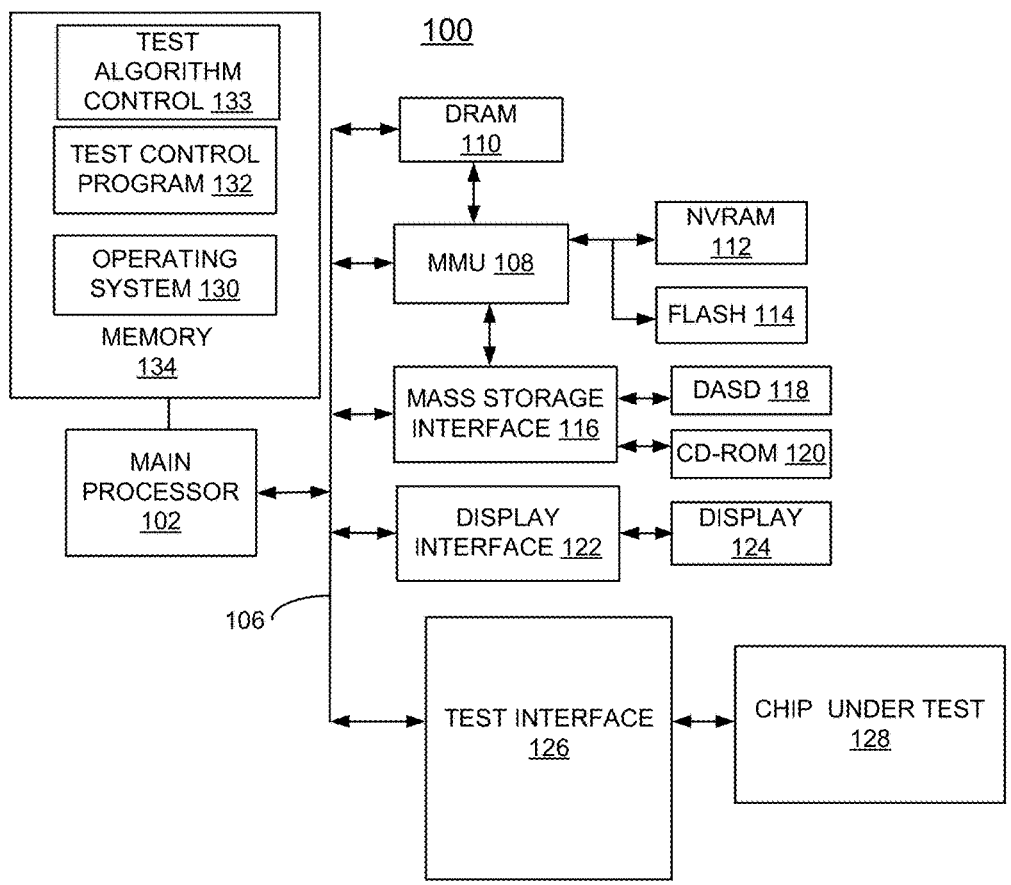
FIG. 1 is a block diagram representation illustrating an example computer test system for implementing enhanced scan data testing with over masking removal in an on product multiple input signature register (OPMISR) test, and a design structure on which the subject circuit resides in accordance with the preferred embodiment.

With reference now to the drawings, in FIG. 1, there is shown an exemplary computer test system for implementing enhanced scan data testing with removal of over masking in an on product multiple input signature register (OPMISR) test generally designated by the reference character 100 in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 connected to a display 124, and a test interface 126 coupled to the system bus 106. An integrated circuit device or chip under test 128 is coupled to the test interface 126. Computer system 100 includes an operating system 130, and a test control program 132 and a test algorithm control 133 of the preferred embodiment resident in a memory 134.

Computer test system 100 is shown in simplified form sufficient for understanding the present invention. The illustrated computer test system 100 is not intended to imply architectural or functional limitations. The present invention can be used with various hardware implementations and systems and various other internal hardware devices, for example, multiple main processors.

Figure 2A:
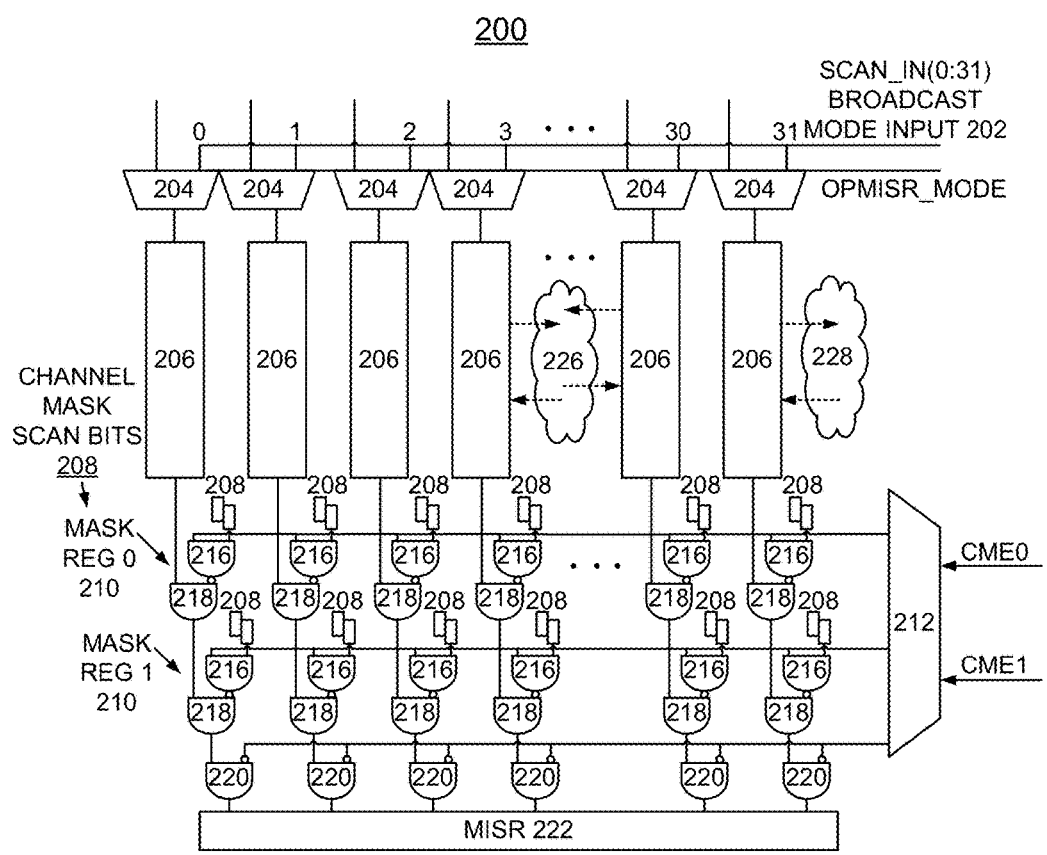

Referring now to FIGS. 2A and 2B, there is shown an example on product multiple input signature register (OPMISR) test circuit generally designated by the reference character 200 in accordance with preferred embodiments of the invention. The OPMISR test circuit 200 provides channel input patterns via a respective multiplexer 204 to a respective associated scan channel 206 used for the OPMISR scan data testing. A scan-in (0:31) broadcast mode input 202 is selectively coupled by the respective multiplexer 204 responsive to an OPMISR_MODE control input applied to the multiplexers 204. The OPMISR test circuit 200 includes OPMISR masking including two mask latches per MISR bit (referred to as Channel Mask Scan Bits 208 in Channel Mask Scan Registers (CMSRs) 0, 1, 210 and two Channel Mask Enable (CME) signals CME0, CME1 applied to CME logic 212. Each of the channel Mask Scan Registers (CMSRs) 0, 1, 210 include a respective pair of AND gates 216, 218 with an inverted output of AND gate 216 applied to AND gate 218. A respective AND gate 220 coupled to an output of AND gate 218 of mask register 1, 210 and an inverted logic output of CME logic 212 couples a respective channel bit position (0:31) to a Multiple Input Signature Register (MISR) 222 for on-chip data compression. Clouds 226, 228 represent the logic under test that while usually produce predictable data, they may also produce unpredictable values in the channels that require masking.

Referring to FIG. 2B, an example CME function table 230 is shown. For example, the CME signals decode to four states of: no masking (B0, B1: 0 0), use mask register 0 (B0, B1: 0 1), use mask register 1 (B0, B1: 1 0), or global MISR mask all channels (B0, B1: 1 1). The masking is applied as the data is unloaded from the respective channels 206 into the MISR 222. When a bit position in a channel is going to shift into the MISR, the global CME signal is set to the desired mask state. For example, if channel 3 needs scan position 28 to be ignored, when bit 28 of the channel is about to be shifted into the MISR during the unload, the CME signals could be set to use mask register 1. The channel 3 mask scan bit in mask register 1 would have previously been set to mask. Other mask bits for other channels may or may not have been set to mask based on needs for the rest of the scan data unload.

There advantageously can be multiple OPMISR satellites or OPMISR test circuits 200 spread throughout the chip under test. For most efficient scanning and less scan data, the Channel Mask Scan Bits 208 for register 0, 210 and register 1, 210 are scan initialized in parallel and shared across satellites. However this means all satellites have the same mask bits. Additionally, all satellites usually get the same CME information during unload. For the example above, if the first satellite needed bit 4 of the channel mask scan register set and used at the scan position 28 but the second satellite did not, the second satellite would unnecessarily be masked at the same time as the bit in the first register, since both satellites receive the same data for the channel mask scan register. Thus, while it is efficient to share channel mask scan register data, one is left with the problem of over masking. All the channels with their mask bit set will be masked whenever the CME signals say to use that masking, even if only one channel in one satellite needed that bit position masked.

Figure 3A:
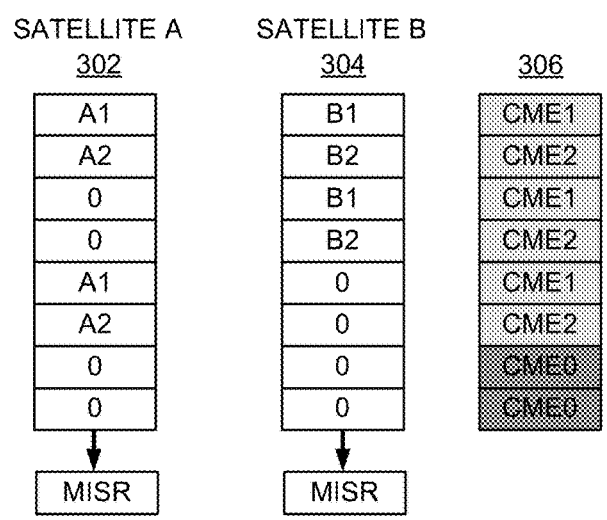
FIGS. 3A and 3B illustrates an example group of OPMISR channels and two satellites A, and B with ideal or required use of CMSRs for each of the scan unloads for 8 cycles of scan unload based on channels masking needs in FIG. 3A and hatched blocks representing conventional over masking problems in FIG. 3B in accordance with preferred embodiments of the invention.
Figure 3B:
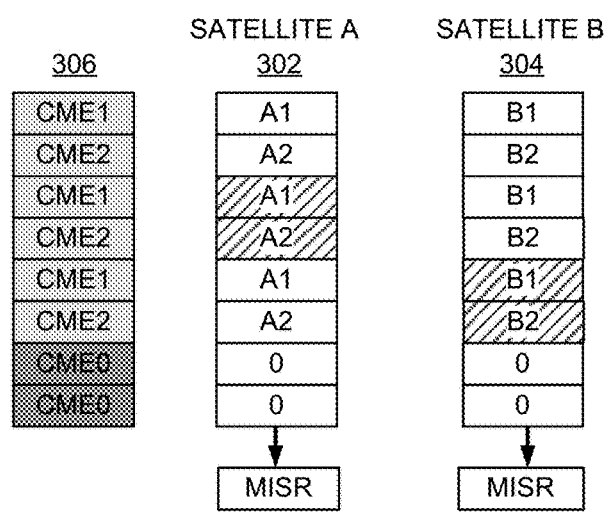

Referring now to FIGS. 3A and 3B, there is shown an example group of OPMISR channels for two satellites 302, A, and 304, B with the required use of CMSRs 306 for each of the scan unloads for 8 cycles of scan unload based on channels masking needs in FIG. 3A generally designated by the reference character 300 with A1/A2 that are the CMSRs 310 for the first satellite 302, A while B1/B2 are the CMSRs for the second satellite 304, B. In FIG. 3B, there is shown an example generally designated by the reference character 310 with hatched blocks representing conventional over masking problems that are avoided in accordance with preferred embodiments of the invention. FIG. 3B illustrates what masking will actually be applied when both satellites 302, A, and 304, B get the same CMEs 306 with hatched blocks representing over masking.

Figure 4:
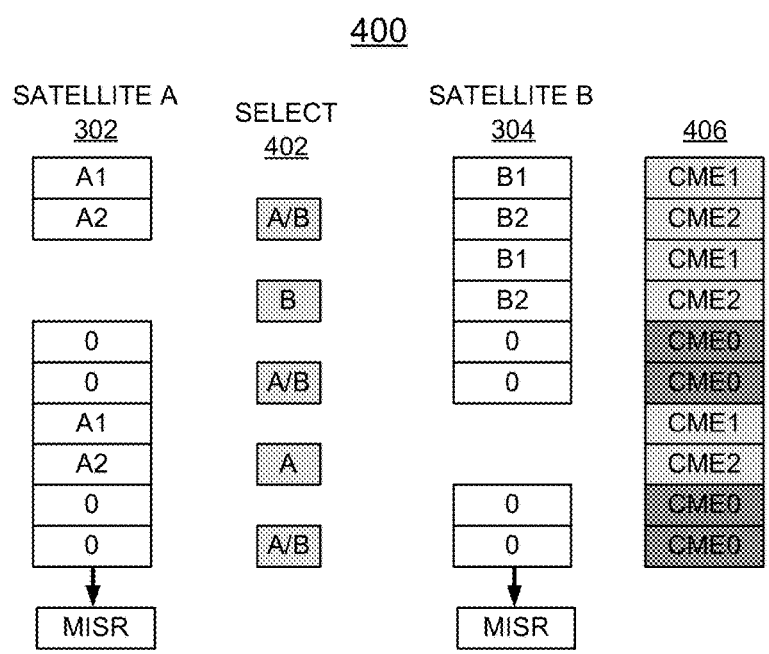
FIG. 4 illustrates the example group of OPMISR channels of FIGS. 3A and 3B after the algorithm is applied to selectively pause the scan unload for the respective satellite or satellites when the wrong CME data for the respective satellite or satellites is at the CME pins for removal of over masking in accordance with preferred embodiments of the invention.

Referring now to FIG. 4, there is shown the example generally designated by the reference character 400 with the group of OPMISR channels of FIGS. 3A and 3B after the algorithm is applied to selectively pause the scan unload for the respective satellite or satellites when the wrong CME data for the respective satellite or satellites is at the CME pins for removal of over masking in accordance with preferred embodiments of the invention. FIG. 4 illustrates how to pause the scan with a select 402 and CME 406 so the correct masking is achieved. There are 10 steps in the new unload example 400 that corrects the mask application. Rather than unload both satellites always, the select decode 402 allow one or both satellite to be unloaded at any step. In this manner when both match in their respective mask application needs both may be selected and unloaded together, but when unique only one will be unloaded while the other is paused.

It should be understood that other operations can be used for unloading. For example, another solution is using Multiple Scan Sections (MSS), which steps through unloading of a full satellite, then moves on to unload the next, and the like; but this would require 16 steps for this example. This seems similar, but as most locations require no masking the shared unloading times (minimum pausing) will actually make the method of the invention as illustrated in FIG. 4 much more efficient, and closer to the original 8 depth than the full MSS option. The method of the invention as shown in FIG. 4 removes all over-masking due to having common CMEs.

Figure 5A:
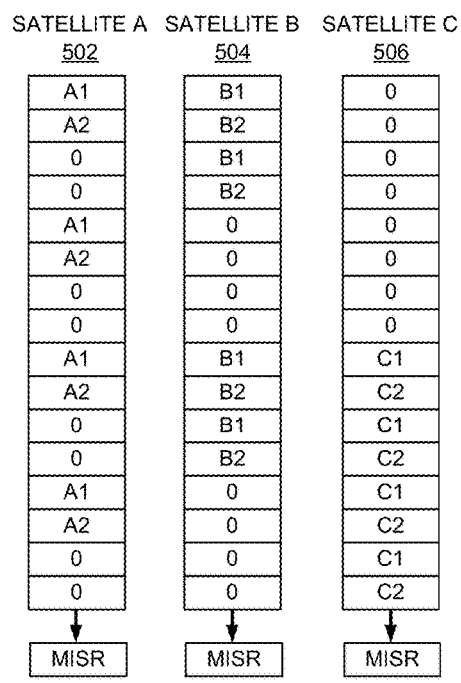
FIGS. 5A and 5B together illustrates an example group of OPMISR channels and three satellites A, B, and C with required use of CMSRs for each of the scan unloads for 16 cycles of scan unload based on channels masking needs in FIG. 5A and hatched blocks representing conventional over masking problems in FIG. 5B in accordance with preferred embodiments of the invention; in accordance with preferred embodiments of the invention.
Figure 5B:
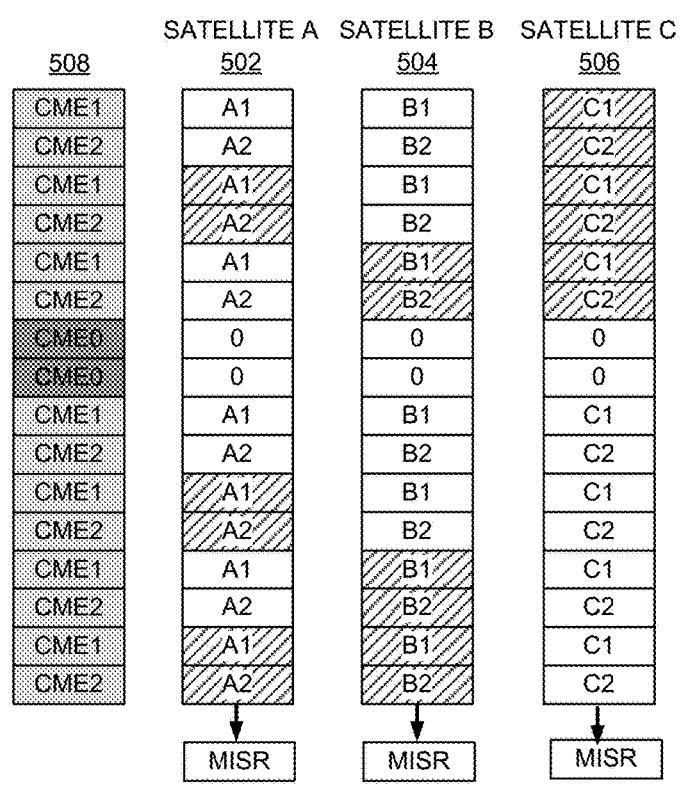

Referring now to FIGS. 5A and 5B, that together illustrate an example generally designated by the reference character 500 group of OPMISR channels and three satellites 502, A, 504, B, and 506, C and CMEs 508 with required use of CMSRs 510 for each of the scan unloads for 16 cycles of scan unload based on channels masking needs in FIG. 5A with A1/A2 that are the CMSRs 510 for the first satellite 502, A while B1/B2 are the CMSRs for the second satellite 504, B, and C1/C2 are the CMSRs for the third satellite 506, C. In FIG. 5B, there is shown an example generally designated by the reference character 520 with hatched blocks representing conventional over masking problems that are avoided in accordance with preferred embodiments of the invention. FIG. 5B illustrates what masking will actually be applied when satellites 502, A, 504, B, and 506, C get the same CMEs 508 with hatched blocks representing over masking during the scan unloads for 16 cycles, when masks are applied when no masking was actually required.

Figure 6:
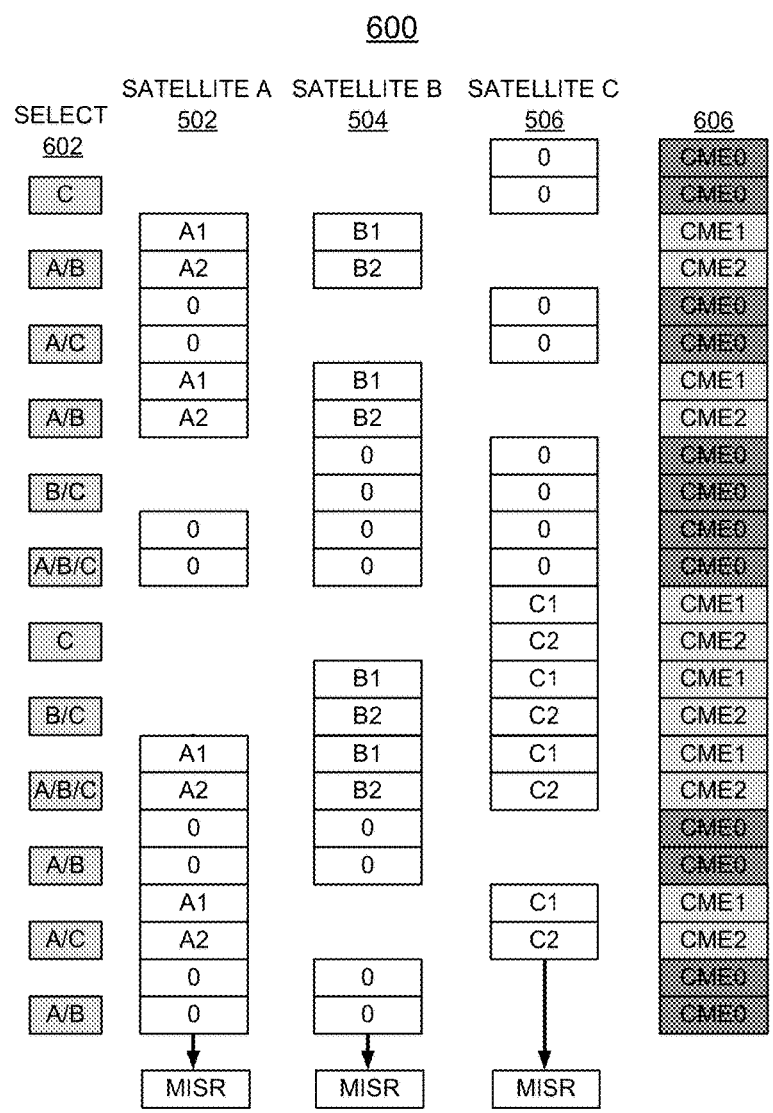
FIG. 6 illustrates the example group of OPMISR channels of FIGS. 5A and 5B after the algorithm is applied to selectively pause the scan unload for the respective satellite or satellites when the wrong CME data for the respective satellite or satellites is at the CME pins for removal of over masking in accordance with preferred embodiments of the invention.

Referring now to FIG. 6, there is shown the example generally designated by the reference character 600 with group of OPMISR channels of FIGS. 5A and 5B after the algorithm is applied to selectively pause the scan unload for the respective satellite or satellites when the wrong CME data for the respective satellite or satellites is at the CME pins for removal of over masking in accordance with preferred embodiments of the invention. FIG. 6 illustrates how to pause the scan with a select 602 and CME 606 so the correct masking is achieved. FIG. 6 shows the now 24 steps in the new unload that corrects the mask application. Rather that unload both sections always, the select decode 602 allows one or both sections to be unloaded at any step. In this manner when any match in a mask application is needed they are selected and unloaded together, but when unique only one is unloaded while the others are paused. This removes all over-masking due to having common CMEs 606.

It should be understood that other operations can be used for unloading. For example, using Multiple Scan Sections (MSS), which steps through unloading of a full satellite, then moves on to unload the next, and the like; but this would require 48 steps for this example. This seems similar, but as most locations require no masking the shared unloading times (minimum pausing) will actually make the method of the invention as illustrated in FIG. 6 much more efficient, and closer to the original 16 depth than the full MSS option. The method of the invention as shown in FIG. 6 removes all over-masking due to having common CMEs.

Figure 7:
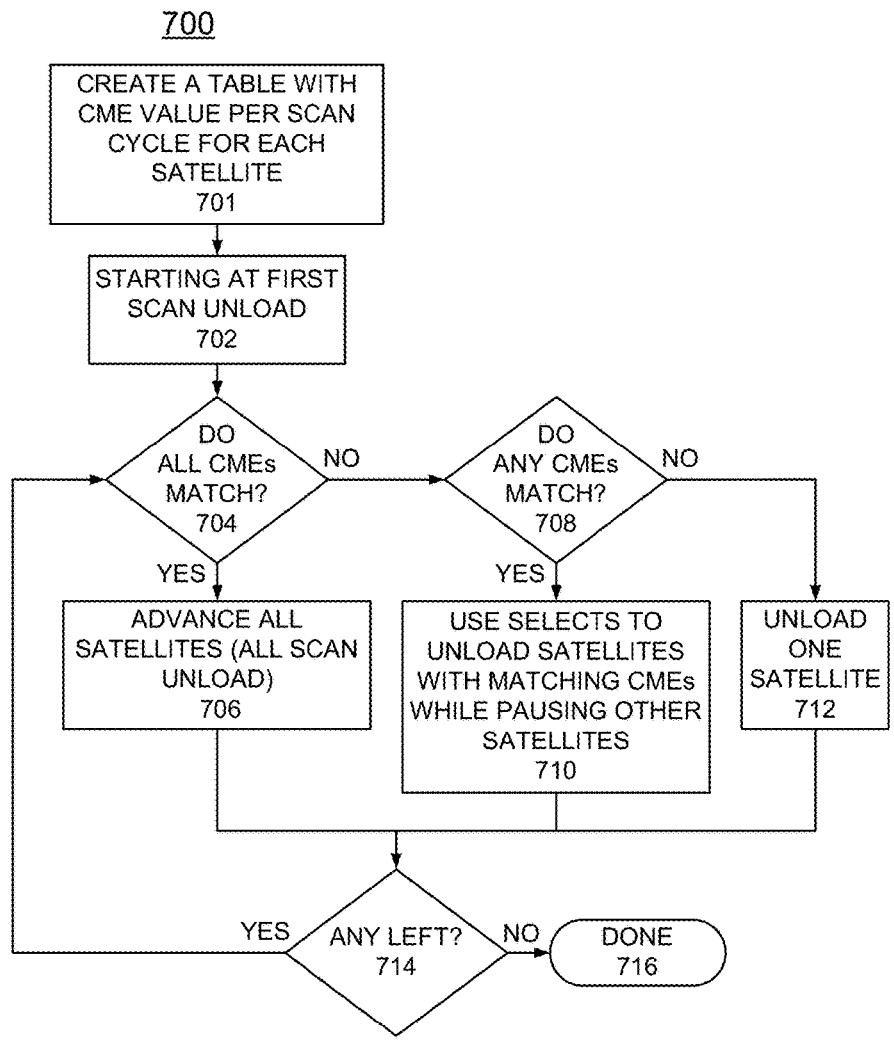
FIG. 7 is a flow chart illustrating example circuit functions to implement algorithm test operations in accordance with the preferred embodiments.

Referring now to FIG. 7, there is shown an example circuit functions to implement algorithm test operations generally designated by the reference character 700 starting at a block 701 with creating a table with CME value per scan cycle for each satellite. At block 701, data from the test generation tool or test algorithm control 132 details CME values for each satellite for each scan unload bit position.

In accordance with features of the invention, the algorithm reasonably efficiently determines the order of satellite selection and CMEs.

As indicated at a block 702, starting at a first scan unload bit position across all satellites is performed. As indicated at a decision block 704, checking if all CMEs match is performed. When all CMEs matching is identified, all satellites are advanced and all the satellites are unloaded for one scan cycle as indicated at a block 706.

As indicated at a decision block 714, checking if any satellite with scan unload bit position are left and if any are left then operations return to decision block 704 and the process repeats. If some CMEs match at decision block 708, then the matching CMEs are selected for unload at block 710 while other not selected are paused. Again if any are left the process repeats until done as indicated at a block 716.

It should be understood that the present invention is not limited to the illustrated circuit functions 700 of FIG. 7. For example, this process could be improved if not just the current CMEs states waiting for unload are queried, but the process were to look ahead to the upcoming CMEs and attempt to align more. This could involve looking ahead one cycle or could favor lesser used CMEs across the entire scan which should then allow more common CMEs to align.

Figure 8:
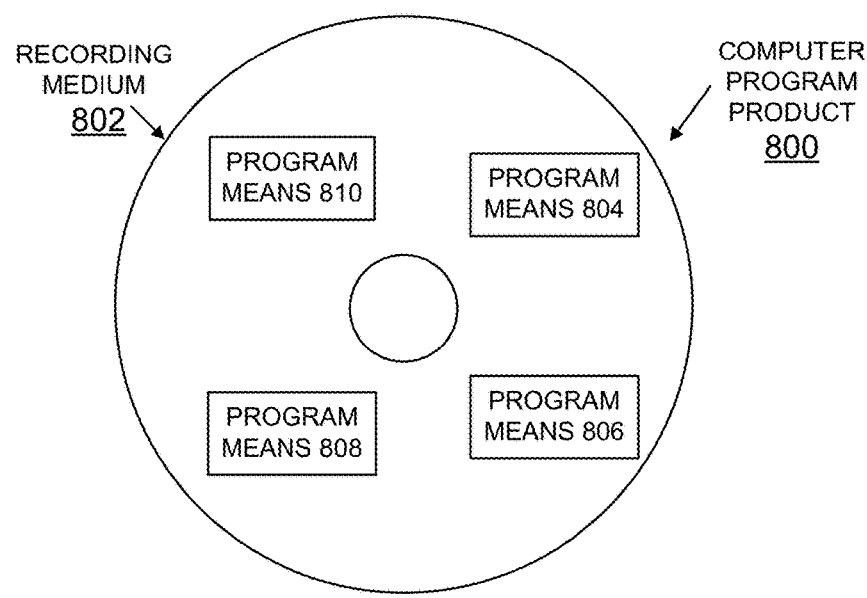
FIG. 8 is a block diagram illustrating a computer program product in accordance with the preferred embodiments.

It should be understood that the present invention is not limited to the illustrated examples of CMEs. Note that all of the examples used only the most common 3 of the 4 possible CMEs. The fourth, CME3, selects masking of all channels on all satellites for that single scan unload cycle. This is extreme and thus rarely used, so was not focused on in the examples. Though that decode also fits within the operations of the invention. Similarly the examples showed two or three satellites, though there can be many more Referring now to FIG. 8, an article of manufacture or a computer program product 800 of the invention is illustrated. The computer program product 800 includes a recording medium 802, such as, a floppy disk, a high capacity read only memory in the form of an optically read compact disk or CD-ROM, a tape, or another similar computer program product. Recording medium 802 stores program means 804, 806, 808, and 810 on the medium 802 for carrying out the methods for implementing enhanced scan data testing of the preferred embodiment in the system 100 of FIG. 1.

A sequence of program instructions or a logical assembly of one or more interrelated modules defined by the recorded program means 804, 806, 808, and 810, direct the computer system 100 for implementing enhanced scan data testing of the preferred embodiment.

Figure 9:
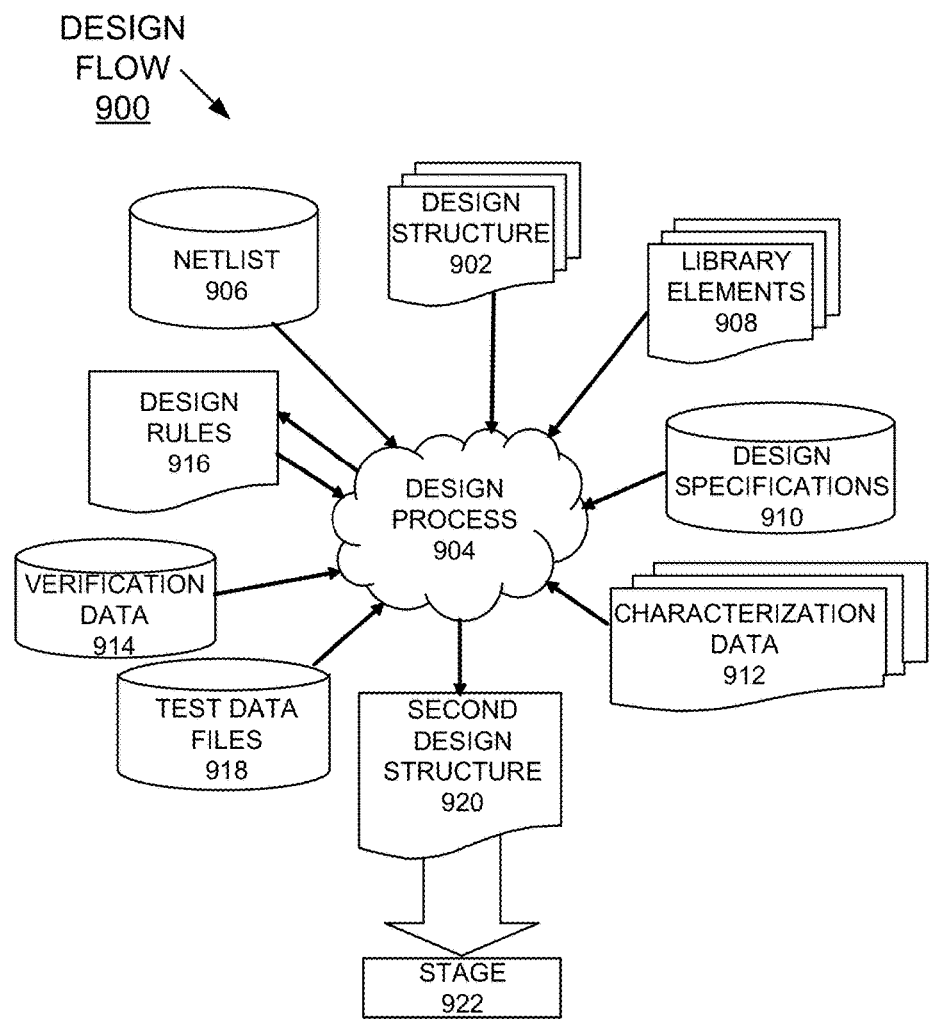
FIG. 9 is a flow diagram of a design process used in semiconductor design, manufacturing, and/or test.

FIG. 9 shows a block diagram of an example design flow 900. Design flow 900 may vary depending on the type of IC being designed. For example, a design flow 900 for building an application specific IC (ASIC) may differ from a design flow 900 for designing a standard component. Design structure 902 is preferably an input to a design process 904 and may come from an IP provider, a core developer, or other design company or may be generated by the operator of the design flow, or from other sources. Design structure 902 comprises circuits 100, 200, 700 in the form of schematics or HDL, a hardware-description language, for example, Verilog, VHDL, C, and the like. Design structure 902 may be contained on one or more machine readable medium. For example, design structure 902 may be a text file or a graphical representation of circuit 100, 200, 700. Design process 904 preferably synthesizes, or translates, circuits 100, 200, 700 into a netlist 906, where netlist 906 is, for example, a list of wires, transistors, logic gates, control circuits, I/O, models, etc. that describes the connections to other elements and circuits in an integrated circuit design and recorded on at least one of machine readable medium. This may be an iterative process in which netlist 906 is resynthesized one or more times depending on design specifications and parameters for the circuits.

Design process 904 may include using a variety of inputs; for example, inputs from library elements 909 which may house a set of commonly used elements, circuits, and devices, including models, layouts, and symbolic representations, for a given manufacturing technology, such as different technology nodes, design specifications 910, characterization data 912, verification data 914, design rules 916, and test data files 919, which may include test patterns and other testing information. Design process 904 may further include, for example, standard circuit design processes such as timing analysis, verification, design rule checking, place and route operations, and the like. One of ordinary skill in the art of integrated circuit design can appreciate the extent of possible electronic design automation tools and applications used in design process 904 without deviating from the scope and spirit of the invention. The design structure of the invention is not limited to any specific design flow.

Design process 904 preferably translates an embodiment of the invention as shown in FIGS. 1, 2A, and 7 along with any additional integrated circuit design or data (if applicable), into a second design structure 920. Design structure 920 resides on a storage medium in a data format used for the exchange of layout data of integrated circuits, for example, information stored in a GDSII (GDS2), GL1, OASIS, or any other suitable format for storing such design structures. Design structure 920 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2A, and 7. Design structure 920 may then proceed to a stage 922 where, for example, design structure 920 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing enhanced scan data testing with over masking removal in an on product multiple input signature register (OPMISR) comprising:

providing a plurality of OPMISR satellites, each of the plurality of OPMISR satellites including a multiple input signature register (MISR) for data collection and a plurality of associated scan channels;

providing common Channel Mask Scan Registers (CMSR) data and common Channel Mask Enable (CME) pins with the multiple input signature register (MISR) in each OPMISR satellite;

providing a select signal in each OPMISR satellite, where said select signal controls advancing the scan unload into the MISR;

using an algorithm for implementing enhanced scan data testing by selectively pausing scan unload for each respective selected OPMISR satellite; and using said select signal in respective satellite channels to selectively pause the scan unload for the respective OPMISR satellite when wrong CME data for the respective OPMISR satellite is at the CME pins for avoiding over masking.

2. The method as recited in claim 1, wherein using said algorithm for implementing enhanced scan data testing enables data volume reduction and minimizing over masking.

3. The method as recited in claim 1, wherein selectively pausing scan unload for each respective selected OPMISR satellite comprises identifying CME values for each OPMISR satellite for each scan unload bit position for use to determine an order of satellite selection and CMEs.

4. The method as recited in claim 3, further comprising starting operations with a first scan unload bit position across all OPMISR satellites.

5. The method as recited in claim 4, further comprising for each OPMISR satellite with data ready at unload, determining if all CMEs match for all the OPMISR satellites.

6. The method as recited in claim 4, further comprising when all CMEs match for all the OPMISR satellites, unloading all the OPMISR satellites for one scan cycle.

7. The method as recited in claim 4, further comprising when all CMEs do not match for all the OPMISR satellites, determining if any CMEs match for respective OPMISR satellites.

8. The method as recited in claim 7, further comprising unloading one OPMISR satellite when there are no CMEs matches.

9. The method as recited in claim 7, further comprising when some CMEs match, selecting the corresponding OPMISR satellites of the matching CMEs for unload.

10. The method as recited in claim 9, further comprising selectively pausing scan unload of other respective OPMISR satellite or OPMISR satellites.

11. A test circuit for implementing enhanced scan data testing with over masking removal in an on product multiple input signature register (OPMISR) comprising:

a plurality of OPMISR+ satellites, each of the plurality of OPMISR+ satellites including a multiple input signature register (MISR) for data collection and a plurality of associated scan channels;

common Channel Mask Scan Registers (CMSR) data and common Channel Mask Enable (CME) pins with the multiple input signature register (MISR) in each OPMISR+ satellite;

a select signal in each OPMISR+ satellite, where said select signal controls advancing the scan unload into the MISR;

a processor; and a test algorithm control logic, which when implemented causes the processor to:

selectively pause scan unload for each respective selected OPMISR+ satellite by utilizing said select signal to pause the scan unload for a respective OPMISR+ satellite when wrong CME data for the respective OPMISR+ satellite is at the CME pins, thereby avoiding over masking.

12. The test circuit as recited in claim 11, further comprising control code stored on a computer readable medium, and wherein said processor uses the control code for implementing enhanced scan data testing.

13. The test circuit as recited in claim 11, said test algorithm control logic to selectively pause the scan unload for each respective selected OPMISR+ satellite comprises logic to identify CME values for each OPMISR+ satellite for each scan unload bit position for use to determine an order of satellite selection and CMEs.

14. The test circuit as recited in claim 13, wherein said test algorithm control logic to selectively pause the scan unload for each respective selected OPMISR+ satellite further comprises logic to start operations with a first scan unload bit position across all OPMISR+ satellites.

15. The test circuit as recited in claim 14, wherein said test algorithm control logic to selectively pause the scan unload for each respective selected OPMISR+ satellite further comprises logic to, for each OPMISR+ satellite with data ready at unload, determine if all CMEs match for all the OPMISR+ satellites.

16. The test circuit as recited in claim 14, wherein said test algorithm control logic to selectively pause the scan unload for each respective selected OPMISR+ satellite further comprises logic to unload all the satellites for one scan cycle when all CMEs match for all the OPMISR+ satellites.

17. The test circuit as recited in claim 14, wherein said test algorithm control logic to selectively pause the scan unload for each respective selected OPMISR+ satellite further comprises logic to, when all CMEs do not match for all the OPMISR+ satellites, determine if any CMEs match for respective OPMISR+ satellites.

18. The test circuit as recited in claim 17, wherein said test algorithm control logic to selectively pause the scan unload for each respective selected OPMISR+ satellite further comprises logic to unload one OPMISR+ satellite when there are no CMEs matches.

19. The test circuit as recited in claim 18, wherein said test algorithm control logic to selectively pause the scan unload for each respective selected OPMISR+ satellite further comprises logic to, when some CMEs match, select the corresponding OPMISR+ satellites of the matching CMEs for unload.

20. The test circuit as recited in claim 19, wherein said test algorithm control logic to selectively pause the scan unload for each respective selected OPMISR+ satellite further comprises logic to selectively pause scan unload of other respective OPMISR+ satellite or OPMISR+ satellites.

* * * * *